United States Patent [19]

Bluzer

[11] Patent Number: 4,941,029
[45] Date of Patent: Jul. 10, 1990

[54] HIGH RESISTANCE OPTICAL SHIELD FOR VISIBLE SENSORS

[75] Inventor: Nathan Bluzer, Silver Spring, Md.

[73] Assignee: Westinghouse Electric Corp., Pittsburgh, Pa.

[21] Appl. No.: 706,436

[22] Filed: Feb. 27, 1985

[51] Int. Cl.$^5$ .................. H01L 27/14; H01L 31/00
[52] U.S. Cl. ........................................ 357/30; 357/31
[58] Field of Search .................... 357/19, 30, 31; 340/870.29; 307/311; 250/211 J

[56] References Cited

U.S. PATENT DOCUMENTS

| | | | |
|---|---|---|---|
| 3,969,751 | 7/1976 | Drukaroff et al. | 357/30 |
| 4,096,512 | 6/1978 | Polinsky | 250/211 J |
| 4,148,048 | 4/1979 | Takemoto et al. | 357/30 |
| 4,244,000 | 1/1981 | Ueda et al. | 357/30 |
| 4,412,236 | 10/1983 | Sosano et al. | 357/30 |
| 4,467,341 | 8/1984 | Suzuki | 357/30 |
| 4,532,536 | 7/1985 | Hatanaka et al. | 357/30 |
| 4,549,195 | 10/1985 | Bluger | 357/30 |

*Primary Examiner*—Nelson Moskowitz
*Attorney, Agent, or Firm*—W. G. Sutcliff

[57] ABSTRACT

An improved light shield for selectively shielding selected light sensitive elements in a visible sensor semiconductor device from incident light comprising a layer of high resistance semiconductor material carried upon the surface of the semiconductor substrate. The high resistance semiconductor material is selected to have a band gap narrower than the silicon semiconductor material it is shielding in order to substantially absorb light which would otherwise fall upon the shielded photosensitive elements.

4 Claims, 3 Drawing Sheets

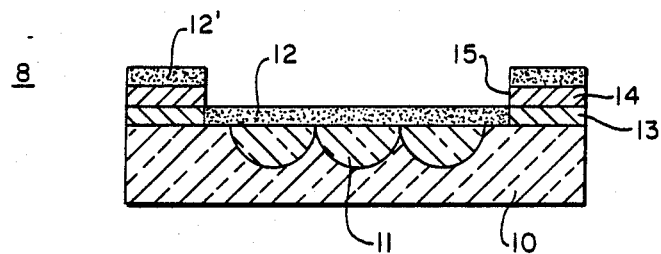
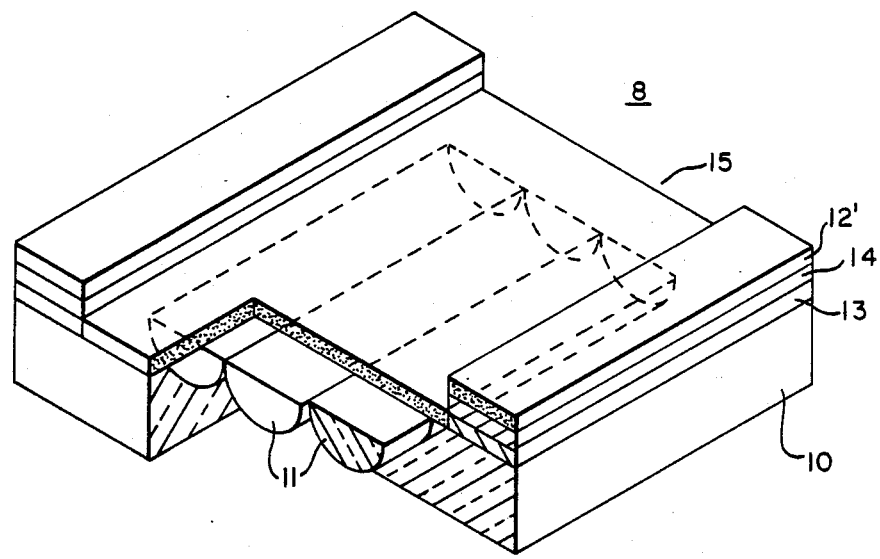

HIGH RESISTANCE OPTICAL SHIELD FOR VISIBLE SENSORS

GOVERNMENT CONTRACT

This invention was made in the performance of a contract with the United States Air Force, Contract No. F33615-81-C-1425.

BACKGROUND OF THE INVENTION

1. Field of the Invention

The present invention relates to an improved light shield for selectively shielding light sensitive elements in a visible sensor semiconductor device from incident light.

2. Description of Prior Art

Semiconductor devices often comprise light sensitive elements of diverse types made with signal processing circuitry in the same semiconductor substrate. For example, solid state imaging devices can contain detectors and signal processing circuitry on the same silicon chip. The material used in both detectors and the signal processing circuitry is of a photosensitive nature. Incident light that would be essential for the operation of the detectors would be the cause of false signals due to the corruption of the device's output by light absorption in the signal processing circuitry.

Because the light sensitive elements are in close proximity to the signal processing circuitry, special shielding must be built into the device to produce the required selective light shielding. Light must be blocked from striking the signal processing circuitry while allowed free access to the detectors.

In principle, light shields constructed of metal or photoresist could be extremely effective in limiting light exposure to the photodetectors of the semiconductor. However, inherent problems occur with both light shield types now used throughout the industry.

The significant amount of processing circuitry on modern solid state sensors requires a proportional amount of shield overlay to block incident light from the light sensitive processing circuitry. It has not been uncommon to encounter electrical shorts between the metallic light shield layer and the underlying shielded circuitry. This three-fold reduction in a device yield from a wafer due to shorts between the metallic shield and the signal processing circuitry is an expensive problem directly related to the use of metallic light shields. Elimination of the shorting problem while still retaining the basic light shield function would of course result in a significant cost benefit to the manufacturing sector.

A patent which describes a light shield and its use is U S. Pat. No. 3,969,751, "Light Shield for a Semiconductor Device Comprising Blackened Photoresist", dated July 13, 1976, to Israel Drukaroff. This patent taught an opaque layer of material nontransmissive to light, i.e., blackened photoresist, blackened metal or plastic containing particles of black carbon. Photoresist and plastic blackened materials should indeed resolve the problem of metal light shield of shorting between the shield and the processing circuitry. However, both photoresist and plastic containing blackened carbon exhibit instabilities which are accelerated when the layers are exposed to light over long periods of time. This photodegradation, i.e., cracking and peeling is deleterious to the continued effective performance of a light shield.

SUMMARY OF THE INVENTION

In accordance with the present invention semiconductor material layer is deposited onto the surface of a protected semiconductor device and then the semiconductor layer is selectively patterned to provide open and shielded areas. Light may enter the semiconductor device only through the openings in the light shield layer. Regions where the light shield layer has not been removed remain shielded. Light incident on the shielded regions will be absorbed by the light shield over the spectral region to which the device is sensitive.

This solid state imaging device comprises a silicon chip incorporating photodetectors and photo signal processing circuitry sensitive to light, and a light shield disposed as a layer upon the photo signal processing circuitry. Any other elements of this solid state imaging device sensitive to light which are required to be shielded from incident light for proper device operation are also shielded by this light shield layer. The improved light shield comprises a high electrical resistance semiconductor material having a narrower band gap than the band gap of silicon. Also, the light shield layer has a predetermined thickness sufficient to provide adequate light shielding.

BRIEF DESCRIPTION OF THE DRAWINGS

For a better understanding of the invention, reference may be had to the preferred embodiment, exemplary of the invention, shown in the accompanying drawings, in which:

FIG. 1 is a cross section illustrating the typical arrangement of the silicon substrate, photodetector regions and silicon dioxide insulating material which is utilized in accordance with the present invention;

FIG. 2 is an isometric representation of the preferred embodiment showing the same elements as shown in FIG. 1;

DESCRIPTION OF THE PREFERRED EMBODIMENTS

Figure 3:
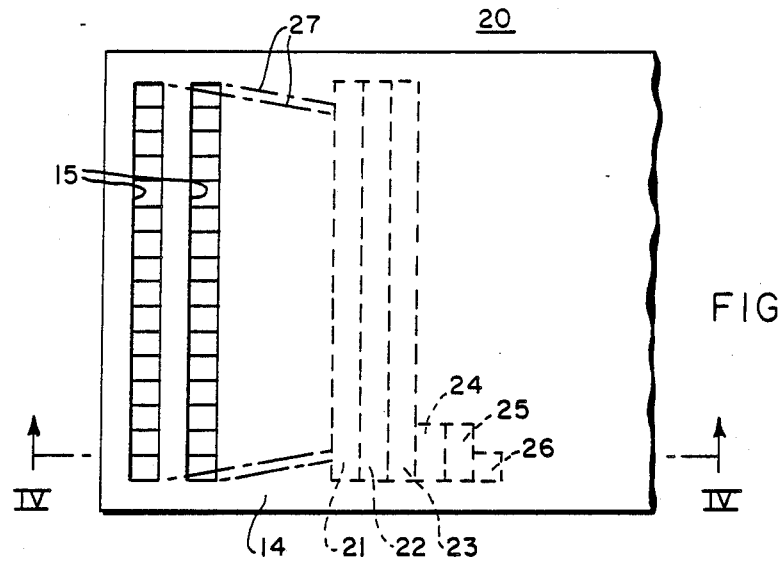
FIG. 3 is a fragmentary plan view of a typical linear array photosensor device with peripheral circuitry disposed on a common substrate.

In this application the term photosensitive semiconductor device is meant to include all regions of semiconductor material in which carriers contributing to an output signal are generated by the irradiation of incident light on that region. One surface of the active region is formed of a main junction towards which those photogenerated carriers move.

In utilizing the term charge transfer device, hereinafter referred to as CTD, it is meant to include charge coupled devices (CCD), bucket brigade devices (BBD) and other devices that have input portions to form charge packets and read out the analog or digital values of such charge packets including, of course, photosensitive devices. The term CCD as used herein is meant to include both the surface channel and the bulk channel type of device. The term surface channel is meant to include those devices where the charge is moved between a semiconductor body and the overlying dielectric. In the bulk channel type of CCD, the term includes those devices where the charges move within the semiconductor body. The term bulk channel CCD is meant to include both those that have a shallow channel and a deep channel that is greater than one micron. In the shallow channel devices, those include the CCD's referred to as a buried channel or bulk channel.

These devices in accordance with the preferred embodiment of the present invention will provide simplicity in structure and operate equally as well regardless of the particular type of CTD utilized. In summary, the present invention in its preferred embodiment would be applicable to all light detecting semiconductor devices in general and specifically to the CCD light detecting device structure.

FIG. 1 is a semiconductor device 8 comprising a silicon substrate 10 and a multiplicity of photodetector elements 11 disposed upon it. The silicon substrate 10 has been selectively doped with regions of either N+ or P type dopant to form the elements 11. A silicon dioxide insulating layer 12 is disposed upon the silicon substrate 10, wherein photodetector elements 11 and light sensitive signal processing circuitry 13 are disposed and are then covered with a layer of amorphous semiconductor material 14. This layer of amorphous semiconductor material 14 serves as a light shield for the underlying photosensitive signal processing circuitry. Selected portions of this light-shield material 14 are removed over those areas where incident light is required. This window area 15 permits incident light to freely strike the photodetector elements 11. A final insulating layer of silicon dioxide 12' is disposed upon portions of the semiconductor device 8.

FIG. 2 is an isometric view of the semiconductor device 8 generally as shown in FIG. 1. The semiconductor substrate 10 is overlayed with the silicon dioxide insulation layer 12 and a single photodiode 11 is shown as formed in the substrate 10 with light sensitive signal processing circuitry 13. The amorphous semiconductor region 14 is sandwiched between two silicon dioxide insulating layers, 12 and 12'. The window area 15 allows incident light to freely strike the photodetector element 11.

FIG. 3 is a fragmentary plan view of a photosensitive device 20 with distinct processing circuitry 21, 22, 23, 24, 25 and 26 and parallel linear array photodetector regions 11. The linear array of photosensitive diodes 11 are fully exposed to incident light while the underlying peripheral circuitry consisting of; injectors 21, transfer gates 22, readout registers 23, readout hold 4, readout transfer 25, and electrometer 26 remains shielded from said incident light by the amorphous semiconductor light shield 14. Electrical connections between the photosensitive diodes and the processing circuitry 21–26 are represented by the dashed lines 27. Light is permitted to reach the detectors 11 via an opening in the light shield 15.

Figure 4:
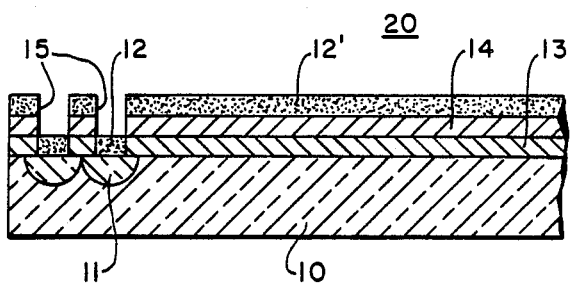
FIG. 4 is a cross-sectional elevation illustrating the device shown in FIG. 3.

FIG. 4 is a cross-sectional elevation of the device shown in FIG. 3, comprising silicon substrate 10 and the amorphous semiconductor light shield 14. Open windows 15 in the light shield layer 14 are covered by upper and lower silicon dioxide layers 12 and 12'. The signal processing circuitry 21, 22, 23, 24, 25 and 26 in region 13 is shielded by the light shield 14.

Figure 5:
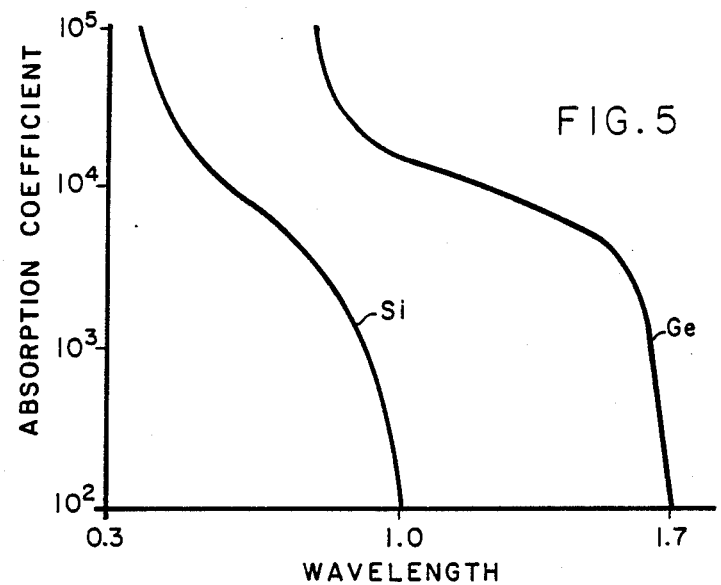
FIG. 5 is a graph demonstrating the relationship between the absorption coefficient versus wavelength for germanium and silicon at 300° K. as it is used in fabrication of the present invention.

FIG. 5, is a graphic representation depicting the relationship between the absorption coefficient $\alpha(cm^{-1})$ versus wavelength for germanium and silicon. Note, that the absorption coefficient of germanium is larger than that of silicon and that germanium has a wider absorption band than silicon.

Figure 6:
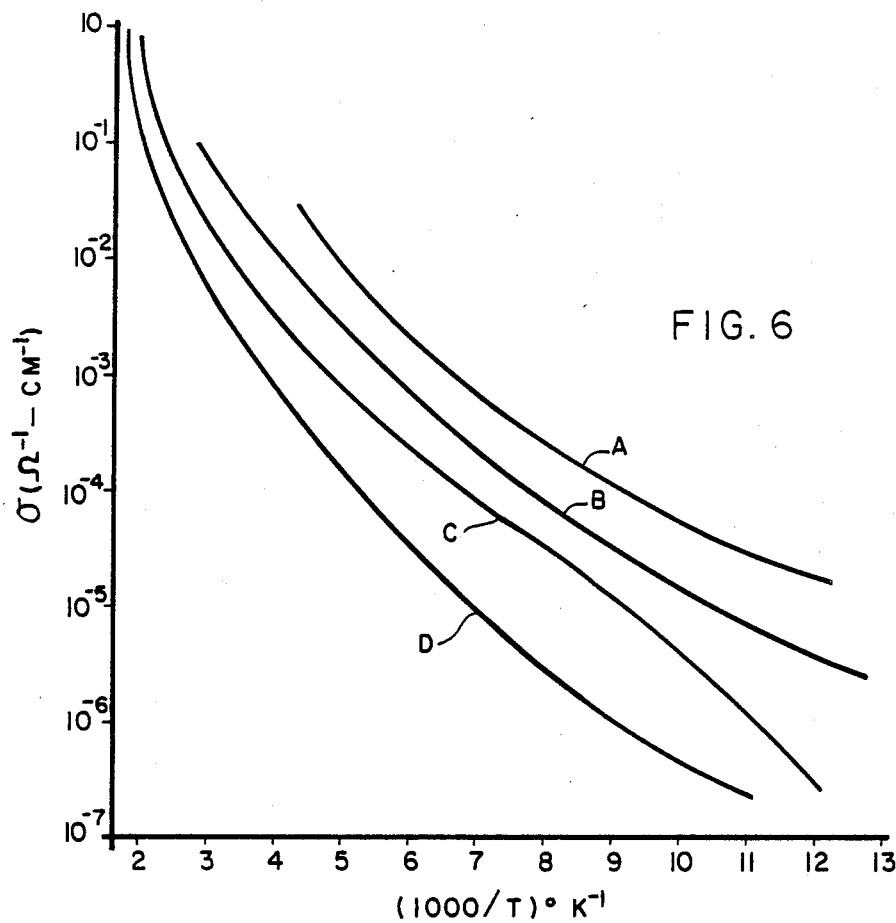
FIG. 6 is a graph describing the conductivity of amorphous germanium deposited at 293° K. as used in fabrication of the present invention.

FIG. 6 is a graphic representation of the conductivity $\sigma(\Omega^{-1}\text{-}cm^{-1})$ of amorphous germanium deposited at 293° K. upon a silicon dioxide layer. This material's varying conductivities during fabrication are shown at various annealing temperatures; curve A, annealed at 293° K., curve B annealed at 373° K., curve C annealed at 473° K. and curve D annealed at 573° K.

In accordance with the present invention a semiconductor material layer is deposited on the surface of a protected semiconductor device. This semiconductor material layer is selectively patterned from to provide open and shielded areas. Light may enter the semiconductor device only through the openings in the light shield layer. Regions where the light shield layers have not been removed will remain shielded from incident light. The incident light will be absorbed by the light shield over a spectral region to which the device is sensing.

This solid state imaging device thus comprises a silicon chip 10 incorporating photodetectors 11 and photosensitive signal processing circuits 13. A layer of silicon dioxide 12 absent "via" windows 15 is applied to the silicon chip substrate. The coating of amorphous semiconductor material having a band gap narrower than the band gap of the silicon chip is then deposited at room temperature upon the silicon dioxide insulating layer. The light shield high resistance material disposed upon the surface of the substrate is selected from, but not exclusive to, the following group of semiconductors; germanium (Ge, band gap 0.66 eV), gallium antimonide (GaSb, band gap 0.72 eV), indium antimonide (InSb, band gap 0.17 eV), indium arsenide (InAs, band gap 0.36 eV), lead sulfide (PbS, band gap 0.41 eV) and lead telluride (PbTe, band gap 0.31 eV). This semiconductor device as described in FIGS. 1 and 2 would thus have a light sensitive high resistance material disposed upon it so selected, that the characteristic absorption coefficient as described in FIG. 5 is sufficiently large to facilitate its use in a layer not exceeding about 6 microns, as explained hereinafter.

A third coating, consisting of silicon dioxide 12', is finally deposited upon the light shield layer 14. This third layer is deposited at a temperature within the range of 293° to 473° K., see FIG. 6. An oxide chemical etch is used to open silicon dioxide deposition windows 15 in this third (top) silicon dioxide layer. The deposition windows 15 are then used as a self-alignment mask. The oxide chemical etches are used in fabricating the present visible sensor devices now utilizing metallic light shields.

A second similar chemical etch applied to the now-exposed light shield material opens window areas. Detector and bonding pad regions would be exposed while the processing circuitry region is shielded by the undoped amorphous semiconductor material. Access to the metal bonding pads would be achieved by yet a third chemical etch applied to the first deposited silicon dioxide layer. All etching techniques are conventional.

To be an effective light shield, a material's inherent optical properties must meet the overall criteria of; an absorption coefficient sufficiently high to provide a thin layer, and a band gap sufficiently less than the band gap of silicon. Germanium, for example, has a narrower band gap than silicon and is a highly absorbing as a material (see FIG. 5). A layer of germanium over silicon would act as an optical bandpass filter transmitting photons with wavelengths which are too long to be absorbed by silicon. The amounts of attenuation the germanium layer would produce would depend upon the optical absorption coefficient, $\alpha$, and the film thickness, T. The amount of light transmitted, $\tau$ through the germanium light shield can be computed utilizing an expression $\tau = \exp(-\alpha T)$.

For example, for 820 nanometers of light and a 3 micron germanium layer, the attenuation would be 99.987%. For a thicker layer, more attenuation can readily be realized; with a 6 micron thick layer the attenuation will be 99.99999831%. Clearly such a large attenuation when 1 out of $10^8$ photons is passed through the light shield is sufficient for most applications.

The resistance of a thin amorphous germanium layer is high. The conductivity of amorphous germanium at room temperature is approximately $10^{-2}$ (S/cm). Thus, a 6 micron thick film will have a sheet resistance of $1.6 \times 10^5$ ohm per square. If pin hole shorts occur between any CCD clocking gates and the germanium light shield, the effect would be equivalent to a shunting resistor (much greater than $10^5$ ohm) between the CCD gates. For devices operating at lower temperatures, the value of any shunting resistance would be several order of magnitudes higher. In either case, no deleterious effects are expected with the aforementioned shunting CCD gates.

The process for incorporating a nonmetallic light shield for sensor fabrication is readily adapted to present process sequences. After the devices are fabricated, they are coated with a finely divided silicon dioxide protective layer before light shield deposition. Such a step will still be used for the nonmetallic light shield case. However, no via windows will be open in the silicon dioxide before the light shield deposition. Thus a germanium light shield will be deposited at room temperature over the silicon dioxide layer. Next, a finely divided silicon dioxide overcoat layer will be deposited over the germanium light shield layer. This silicon dioxide layer should be deposited at a temperature between 293° K. and 473° K. (see FIG. 6). This temperature range was selected to prevent recrystallization of the amorphous germanium film into a polycrystalline state which is less resistive. After the second silicon dioxide deposition windows can be opened within the top silicon dioxide layer with a chemical oxide etch. The open windows can be used as a self-alignment mask to remove the exposed germanium occurring in the detector and bonding pad regions (see FIGS. 2 and 3). After chemically removing the germanium, access to the metal bonding pads can be gained by etching the first silicon dioxide layer. The process sequence described therefore is compatible with current sensor fabrication technology while providing an improved light shield means.

In summary, a nonmetallic light shield as described for replacing the metallic light shield used on present sensor devices provides an improvement over the prior art. The new light shield provides a three-fold improvement in device yield because of its high sheet resistance. This shield improvement is realized without sacrificing the function and ability of blocking light from the new detector regions.

We claim:

1. In combination with a solid state imaging device comprising silicon chip means incorporating photodetectors and photo signal processing circuitry sensitive to light and a light shield means disposed as a layer upon said photo signal processing circuitry and any other elements sensitive to light which are required to be shielded from light for proper device operation, the improved light shield means comprising:

a high electrical resistance semiconductor means conformed as said light shield layer, said semiconductor means having a lower band gap than the band gap of silicon which comprises said chip means; and said semiconductor means layer having a predetermined thickness sufficient to provide incident light shielding.

2. A semiconductor device as defined in claim 1, wherein said light-shield means is a semiconductor high resistance material disposed upon the surface of the substrate material and selected from one of the group consisting of germanium, gallium antimonide (GaSb), indium antimonide, indium arsenide, lead sulfide (PbS), and lead telluride (PbTe).

3. A semiconductor device as defined in claim 1, wherein said light-shield means has a characteristic absorption coefficient sufficiently large to facilitate its use as a layer having a thickness not exceeding about 6 microns.

4. A semiconductor device as defined in claim 1, wherein said photodetectors comprise a linear array of photosensitive regions disposed in a silicon substrate, with the improved light shield means comprising a layer of germanium.

* * * * *